Figure 1:
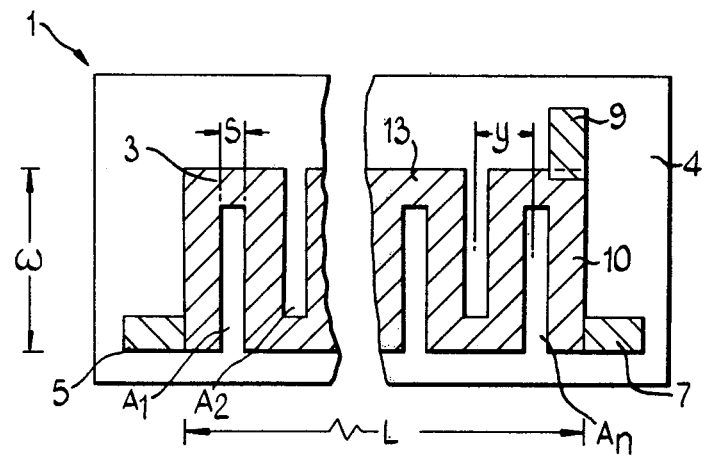

United States Patent [19]

Elliott

[11] 4,258,254
[45] Mar. 24, 1981

[54] IMAGING DEVICES AND SYSTEMS
[75] Inventor: Charles T. Elliott, Malvern, England
[73] Assignee: The Secretary of State for Defence in Her Britannic Majesty's Government of the United Kingdom of Great Britain and Northern Ireland, England
[21] Appl. No.: 29,411
[22] Filed: Apr. 12, 1979
[30] Foreign Application Priority Data
Apr. 25, 1978 [GB] United Kingdom ............... 16279/78
[51] Int. Cl.$^3$ .......................................... H01J 40/14
[52] U.S. Cl. .................................. 250/211 J; 357/30
[58] Field of Search ............... 250/330, 334, 370, 371, 250/211 R, 211 J, 234, 235, 236; 357/29, 30
[56] References Cited
U.S. PATENT DOCUMENTS

| 3,619,621 | 11/1971 | Maret | 250/211 J |
| 3,995,159 | 11/1976 | Elliott | 250/370 |
| 4,096,512 | 6/1978 | Polinsky | 357/30 |

Primary Examiner—David C. Nelms
Attorney, Agent, or Firm—Pollock, Vande Sande and Priddy

[57] ABSTRACT

In order to improve the resolution and performance of an imaging device comprising an elongate strip of photoconductive semiconductor material having first and second current electrodes and an associated read-out electrode the strip is modified so that generated photocarriers are caused to drift in a flow path in which their diffusive spread in the longitudinal direction, from the first electrode to the second electrode, is limited to a spread substantially less than the diffusion length characteristic of the material. In particular the strip may be modified by a plurality of fine interdigital slots extending alternately from opposite sides of the strip and which, in at least a terminal region adjacent the second electrode, are spaced apart by a distance less than the diffusion length.

The device may be used in either a scanned, or a stationary, image system.

8 Claims, 6 Drawing Figures

IMAGING DEVICES AND SYSTEMS

This invention relates to imaging devices and systems, particularly strip detectors and systems incorporating strip detectors.

A typical strip detector (see for example UK Patent Ser. No. 1,488,258) comprises a strip of photoconductive material (eg cadmium mercury telluride) with two current electrodes, one at either end of the strip for applying bias current. Between these electrodes and close to the second, is a read-out electrode which defines a localised sample area. During operation, an infrared scene is focussed on the strip by means of system optics, and ambipolar carriers (that is both electrons and holes paired in charge neutral combination) are photo-induced along the active length of the strip between the two current electrodes. The photo-induced ambipolar carriers have a density profile corresponding to the intensity of the focussed image. When bias current is applied, the ambipolar carriers are caused to drift towards the sample area, where by means of ancillary read-out circuitry connected to the read-out electrode, an electrical signal is derived as a measure of local ambipolar carrier density, the signal being an electrical analogue of the image.

A continuous integration mode of operation of such a strip detector is described in UK Patent Ser. No. 1,488,258, according to which the image is scanned along the detector at a velocity which is matched to the average drift velocity of the ambipolar carriers. In this way the ambipolar carrier density is continuously integrated as the strip is scanned.

Alternatively, in pulsed mode operation of a strip detector, as described in UK Patent Application No. 45995/77, a stationary image is focussed on the detector and a standing distribution of ambipolar carriers is allowed to accumulate. After an accumulation period, not greater in duration than average minority carrier lifetime, a pulsed bias current is applied to sweep the carriers to the read-out region.

Read-out region geometries of the devices referred to above, depend upon the mode of operation, the physical parameters of the photoconductive material (eg carrier mobility, lifetime and diffusion) and upon the current supply and system optics. In particular, the read-out region geometry and associated circuitry may be designed to give optimum image resolution. The electrical signal derived is a measure of ambipolar density averaged over a localised sample area. For example, the read-out circuitry may be designed to detect the conductivity between the second electrode and the read-out electrode; the spacing of these electrodes and the strip width defining a fixed geometry sample area. Alternatively, however, the read-out electrode may be in the form of a diode contact, in which case there is an equivalent sample area, dependent upon the integration period characteristic of the associated read-out circuitry. The equivalent sample area, here, has a dimension 'vt' where 'v' is the velocity of carriers swept towards the diode and 't' is the integration period. For optimum image resolution, sample area dimensions are each no greater than the length over which ambipolar carriers diffuse thermally between generation and detection. Thus where the time between first generation and detection approaches the carrier lifetime, the sample area dimensions are typically of the order of the ambipolar carrier diffusion length. Where the dimensions of the read-out region are greater, resolution becomes geometry dependent, since resolution is lost by averaging over sample area. Where the dimensions are smaller, resolution is diffusion limited, since resolution depends now on diffusive distribution; and also in this case signal output is decreased unnecessarily.

Hitherto, therefore, it has been a problem that resolution has been severely limited by thermal diffusion. Device performance has been limited, and also the choice of suitable materials has been restricted to materials characterised by short diffusion lengths.

Furthermore, thermal diffusion has limited the attainment of higher signal-to-noise ratios. Consider the device described above operated in the continuous integration mode. Its signal-to-noise performance may be compared with a conventional linear array of discrete detector elements, each element being scanned in series, and the output of each being summed via a corresponding individual delay line. Signal-to-noise ratio of the sum of "n" elements is better than that of a single element, by the factor $\sqrt{n}$. By analogy, the strip detector may be considered as comprising the sum of "n" equivalent elements, where "n" is defined in terms of device geometry as:

$$n = 2L/1 = 2L/S$$

Where "L" is the strip length between first and second electrodes, "1" is a sample area dimension, and "S" is the ambipolar carrier diffusion length.

Infra-red systems have been developed for 3 to 5 micron and 8-14 micron band applications. From the point of view of obtaining good signal-to-noise ratio at low spatial frequencies (ie corresponding to images of large objects) long carrier lifetimes are required, but this conflicts with the requirement for good spatial resolution because the diffusion length is proportional to the square root of the lifetime. Long carrier lifetimes are available in cadmium mercury telluride material operated at about 200° K. for 3-5 micron band operation. So far it has not been possible to take full advantage of the improved signal-to-noise ratios which the long lifetimes make possible, because of the degraded spatial resolution (L=60 microns).

According to the present invention an imaging device comprises: an elongate strip of semiconductor material capable of generating photocarriers when an optical radiation image is focussed thereupon; first and second electrodes, spaced apart on the strip, for applying bias current through the strip; and a third electrode disposed between the first and second electrodes, for enabling detection of a measure of local photocarrier density; wherein, between the first and second electrodes, the strip is adapted so that in operation the photocarriers are caused to drift in a flow path in which diffusive spread in a longitudinal direction is limited to a spread substantially less than the diffusion length characteristic of the material.

It is to be understood that reference to an optical radiation image includes reference to an infra-red radiation image.

The strip may be structurally adapted by the provision of a plurality of close-spaced fine interdigital slots extending alternately from opposite sides of the strip, the spacing between alternate slots being less than the diffusion length. Preferably the plurality of slots is situate in a terminal region, of the strip adjacent the second electrode. A further plurality of slots may be provided between the first electrode and the terminal region, the spacing between these slots being of gradually reducing value to match the close spacing of the terminal slots.

Alternatively, the strip may be provided with a multiplicity of slots lying between the first and second electrodes and uniformly spaced there across the slots extending alternately from opposite sides of the strip, the uniform spacing being less than the diffusion length.

The device may be constructed so that it may be operated in the continuous integration mode, or it may be constructed so that it may be operated in the pulsed mode. When constructed for continuous integration mode operation, the device may be incorporated in a system also including optical means for scanning an image along the length of the device and a current source for causing the photocarriers to drift at a predetermined speed along the drift path, the predetermined speed being such that, in operation, the image velocity and that average velocity component of the predetermined drift speed resolved parallel to the length of the strip, are substantially matched so that the photo-carrier density is continuously integrated in register with the scanned image.

In this manner, the photo-carriers diffuse freely in the direction of the drift path only. Diffusion tranverse to the drift path may be geometrically limited, and in any case the diffusive spread in a longitudinal direction, that is the component of diffusion resolved parallel to the length of the strip, is less here than the diffusion length characteristic of the material.

Figure 2:
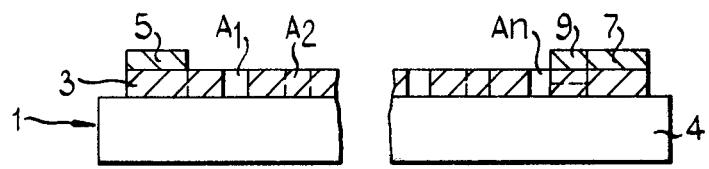
Figure 3:
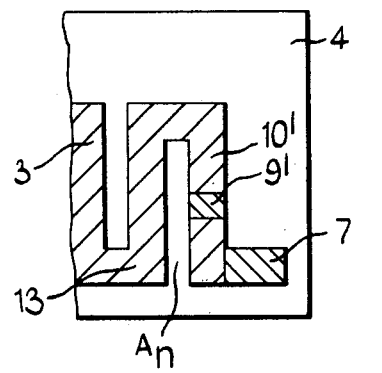
Figure 4:
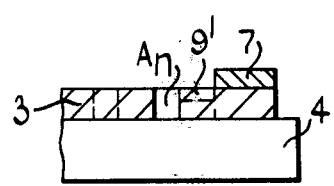
Figure 5:
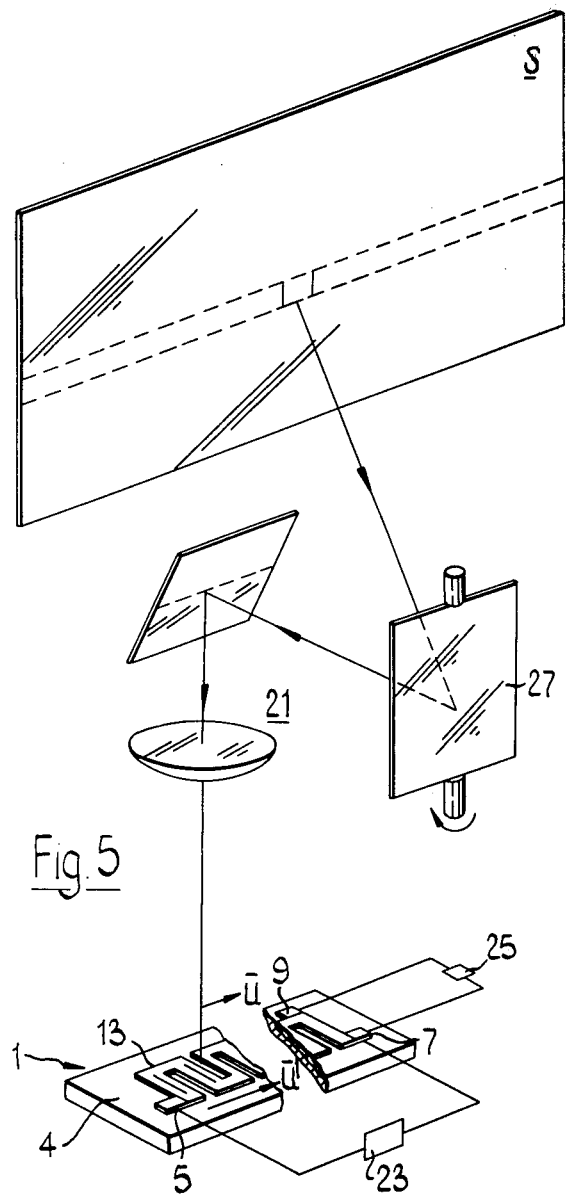
Figure 6:
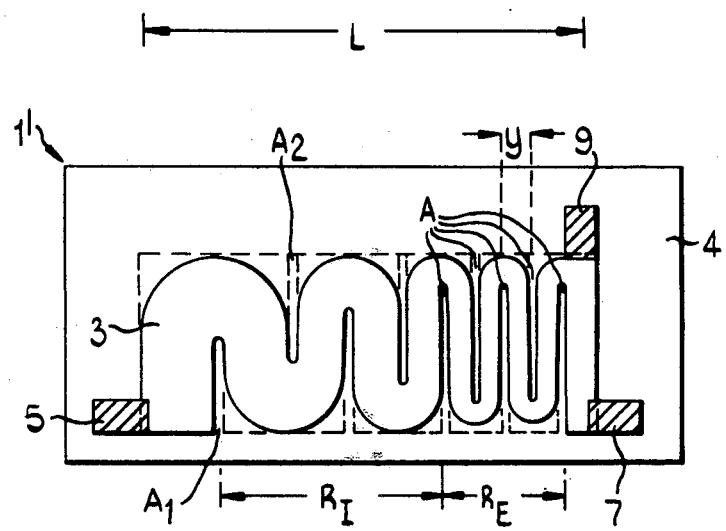

Embodiments of the present invention will now be described, by way of example only, and with reference to the accompanying drawings in which:

FIG. 1: is a plan view of a strip detector adapted for resistive readout;

FIG. 2: is a front elevation of the detector shown in FIG. 1;

FIG. 3: is a plan view of the terminal region of a strip detector constructed for diode readout;

FIG. 4: is a front elevation of the terminal region of the detector shown in FIG. 3;

FIG. 5: is a schematic illustration of an imaging system incorporating the detector shown in either of FIGS. 1 and 2 or FIGS. 3 and 4, adapted for continuous integration operation; and, FIG. 6: is a plan view of a strip detector of alternative construction.

As shown in FIGS. 1 and 2, a strip detector 1 comprises a substrate 3 of photoconductive semiconductor material (eg Cadmium Mercury Telluride) in the form of an elongate strip of width "w" and thickness "t". The substrate is supported on a carrier 4 of insulating material, for example, sapphire. Along the length of the strip are two spaced current electrodes 5,7 separated a distance "L" apart. These may be in the form of metal film contacts (eg gold) deposited on the substrate surface. Between the current electrodes 5,7 there is a multiplicity of open-ended, fine interdigital slots $A_{1,2} \ldots A_n$ of width "s", extending alternately from opposite sides of the substrate 3, and periodically spaced from centre to centre a distance "y" apart, y being less than the diffusion length. The slots $A_{1,2} \ldots A_n$ thus leaves a well defined serpentine structure 13, providing a drift path between input electrodes 5 and 7 of significantly increased length, compared with the electrode separation distance L. The drift path, so provided, traverses the width of the strip and, at least on a microscopic scale, the increase in path length is uniform everywhere along the strip between the electrodes 5 and 7. The increase in path length may be quantified by a factor "f" given by the ratio of the length "P" of the meandering drift path, to the length between electrodes "L":

$$f = P/L \simeq w/y$$

The slots may be formed, for example, by etching. Other techniques, such as those used in SAW device manufacture may be used, but it should be noted that surface defects would provide recombination centres for the electrons and holes, and would thus degrade carrier lifetime. Near-surface defects, produced by such techniques should, therefore, be removed, for example, by an additional step of etching. Since the slots represent a dead space, it is also desirable that their width "s" be kept to a minimum within practical limits, thereby optimising the active area of the substrate surface remaining.

Resistive readout is facilitated by read-out electrode 9 of, for example, gold metal film situated close to the second current electrode 7. The read-out electrode may be of gold metal film, for example, having a transparent portion overlapping part of the substrate, the rest of the electrode extending on to the carrier 4. The read-out electrode 9 and the second electrode 7 between them define a fixed geometry sample area 10. When these electrodes are connected to an ancillary read-out circuit (not shown), a measure of the local ambipolar carrier density, for example, conductivity, averaged over the area 10, may be detected.

Alternatively, diode readout may be provided, as shown in FIGS. 3 and 4. In this case, a read-out tap in the form of a diode electrode 9' is formed on the substrate 3 in the vicinity of the second input electrode 7. The diode may be formed, for example, by p-type diffusion or ion implantation, where the semiconductor is of lightly doped n-type material. In operation, ancillary read-out circuitry connected to electrodes 9' and 7 provides reverse bias for the diode. The integration time "$\tau$" of the ancillary circuit dictates the extent of the equivalent area 10' defined by, and in the vicinity of, the diode electrode 9'. The diode produces a signal current, as a measure of local ambipolar carrier density, as minority carriers are swept across the diode interface. The diode may be considered as sweeping out an effective sample area having a typical dimension "$V\tau$", where "v" is the drift velocity of the carriers, towards the diode 9'.

When an image of an optical radiation scene is focussed upon the substrate surface, ambipolar photo-carriers are photo-induced and a density profile developed along the strip. When bias current is caused to flow through the strip between electrode 5 and electrode 7, the carriers are caused to drift along the meander drift path defined by the serpentine structure 13. The carriers are free to diffuse in the direction of this path. However, transverse to the path, ie in a longitudinal direction, diffusion is limited by deflection at the structure sides. In this way the maximum diffusion spread is limited to less than the characteristic diffusion length, by the approximate factor 1/f.

An image detector system is shown in FIG. 5 and includes, in addition to detector 1, an optic system 21, a bias current supply 23, and read-out circuitry 25. The optic system is arranged to focus an image of an optical radiation scene "S" on to the strip detector. When the system is operated in the continuous integration mode, the optic system 21 includes a scanning mechanism, for example, a rotating mirror 27. Thus an image of the scene may be scanned at the a velocity "u" along the length of the strip detector 1. When bias current is applied to the strip detector 1 via electrodes 5,7, the photo-induced carriers are caused to drift along the meander drift path towards the sample area of the strip with a speed "v". The average velocity "u" with which the photo-carriers drift from electrode 5 to electrode 7 in the direction parallel to the length of the strip, is somewhat less therefore and is given by:

$$u' = (1/f) \cdot v$$

To ensure that the carrier charge is integrated in register with the moving image, the scanning velocity u, and the average carrier velocity u', are matched by adjustment of the scanning mechanism, the bias current, or both:

Thus $u = u' = (1/f) \cdot v$ at adjustment.

Examples of material, physical parameters and typical dimensions will now be given:

Material: lightly doped n-type Cadmium Mercury Telluride with a composition chosen to give a cut-off wavelength of 4 $\mu$m at 193° K. (approximate composition $Cd_{0.28}.Hg_{0.72}.Te$). With a nominal carrier density $5 \times 10^{14}$ cm$^{-3}$, excess carrier lifetime ~20 $\mu$s, minority hole mobility ~200 cm$^2$v$^{-1}$s$^{-1}$, and ambipolar carrier diffusion length ~80$\mu$.

Mode of Operation: Continuous Integration

Thickness: t = 5 $\mu$m
Length:
L = 1.6 × 10$^3$ $\mu$m
y = 20 $\mu$m
w = 60 $\mu$m
s = 8 $\mu$m
Nominal resolution 60 $\mu$m
Data rate: 4.5 × 10$^5$
Scan velocity '$\mu$': 2.7 × 10$^3$ cm s$^{-1}$
Bias current drive voltage: 19 V.
Enhancement of signal-to-noise ratio compared with discrete element factor 3.

Mode of Operation: Pulsed

Thickness: t = 5 $\mu$m
Length:
L = 300 $\mu$m
y = 20 $\mu$m
w = 60 $\mu$m
s = 8 $\mu$m
Nominal resolution: 60 $\mu$m
Number of resolution elements: 5
Accumulation time: 20 $\mu$s
Pulse duration: 2 $\mu$s
Peak Drive voltage at readout: 26 v.

Conventional techniques for preparing thin photoconductive detectors with passivated low surface recombination velocity surfaces may be used. The shape of the device may be defined using photolithographic techniques and etching using 10% Bromine: Methanol, or 10% Bromine: Ethyleneglycol.

In the device 1' shown in FIG. 6 a terminal region $R_E$, of the strip 3, adjacent to the second electrode 7, is provided with a plurality of close-spaced slots A extending alternately from opposite sides of the strip. These slots A are spaced apart each by a distance less than the characteristic diffusion length. As distinct from the construction described above, the close-spaced slots are only provided where the diffusion spread of the photo-carriers would reach a significant value. The increases in the total resistance and total power dissipation resulting from an increase in flow path length are thus of reduced value compared with the increases in resistance and dissipation of the device described earlier. In an intermediate region $R_I$, between the terminal region $R_E$ and the first electrode 5, a further plurality of slots $A_1, A_2 \ldots$ is introduced. In similar manner these extend alternately from opposite sides of the strip 3. The spacing between consecutive slots in this region differs from one pair of consecutive slots to the next and the magnitude of this spacing is gradually reduced as eventually to match the close-spacing of the slots A in the terminal region $R_E$. In this way, the mean deviation of photocarrier velocities is reduced. This is further facilitated by shaping the strip 3. Thus as shown in FIG. 6 the slotted strip 3 has no squared corners, these having been removed by etching. It is arranged that in the intermediate region, the meander path width is gradually and smoothly tapered whilst in the terminal region it is either gradually tapered or, is of approximately constant width (as shown).

I claim:

1. An imaging device comprising:
   an elongate strip of semiconductor material capable of generating photocarriers when an optical radiation image is focussed thereupon;
   first and second current electrodes, spaced apart and situated on the strip, for applying bias current through the strip; and, a read-out electrode situated on the strip between the first and second current electrodes;
   wherein the improvement comprises providing in the strip between the first and second current electrodes, barrier means arranged for partially dividing the volume of the strip so that the diffusion of photocarriers in the longitudinal direction, from the first current electrode to the second current electrode, is limited to a spread substantially less than the diffusion length characteristic of the material.

2. An imaging device according to claim 1 wherein the barrier means comprises a plurality of spaced fine interdigital slots extending alternately from opposite sides of the strip.

3. An imaging device according to claim 2 wherein the slots are spaced apart along the length of the strip between the first and second current electrodes, consecutive slots being spaced apart by a distance less than the diffusion length.

4. An imaging device according to claim 2 wherein the slots are provided in a terminal region adjacent the second current electrode, consecutive slots each being spaced apart by a distance less than the diffusion length.

5. An imaging device according to claim 4 wherein a further plurality of fine interdigital slots, extending alternately from opposite sides of the strip, are provided in an intermediate region of the strip between the first current electrode and the terminal region, each slot in this intermediate region being spaced apart from the next, this spacing decreasing gradually to match the spacing in the terminal region.

6. An imaging device according to claim 2 wherein the strip is shaped to provide a path of approximately constant width, which path meanders between the alternate slots.

7. An imaging system comprising the operative combination of the device according to claim 1; focussing means for focussing an image on the device;
scanning means for scanning the focussed image in a longitudinal direction along the length of the device between the first and second current electrodes;
control means, arranged for providing a continuously swept current of the photocarriers generated within the strip, the control means being capable of imparting to the photocarriers an average longitudinal velocity that is equal to the velocity of the scanned image; and, read-out means co-operative with the read-out electrode, capable of deriving a measure of a magnitude of the photocarrier density localised in the region of the read-out electrode.

8. An imaging system comprisng the operative combination of the device according to claim 1;
focussing means arranged for focussing an image on the device, control means, co-operative with the first and second current electrodes, capable of providing pulsed bias current for sweeping out photocarriers generated and accumulated within the strip; and,
read-out means co-operative with the read-out electrode, capable of deriving a measure of a magnitude of the photocarrier density localised in the region of the read-out electrode.

* * * * *